(12) United States Patent
Iwanami et al.

(10) Patent No.: US 9,182,427 B2
(45) Date of Patent: Nov. 10, 2015

(54) PROBE FOR ELECTRIC/MAGNETIC FIELD

(75) Inventors: Mizuki Iwanami, Tokyo (JP); Tsuneo Tsukagoshi, Tokyo (JP)

(73) Assignee: NEC Corporation, Tokyo (JP)

( * ) Notice: Subject to any disclaimer, the term of this patent is extended or adjusted under 35 U.S.C. 154(b) by 544 days.

(21) Appl. No.: 13/380,485

(22) PCT Filed: Jun. 23, 2010

(86) PCT No.: PCT/JP2010/060657
§ 371 (c)(1),
(2), (4) Date: Jan. 27, 2012

(87) PCT Pub. No.: WO2011/001872
PCT Pub. Date: Jan. 6, 2011

(65) Prior Publication Data
US 2012/0121217 A1 May 17, 2012

(30) Foreign Application Priority Data

Jun. 29, 2009 (JP) ................................. 2009-153787

(51) Int. Cl.
*G01R 15/24* (2006.01)
*G01R 29/08* (2006.01)
*G01R 33/032* (2006.01)
*G02B 6/24* (2006.01)

(52) U.S. Cl.
CPC .............. *G01R 15/247* (2013.01); *G01R 15/24* (2013.01); *G01R 29/0885* (2013.01); *G01R 33/032* (2013.01); *G02B 6/241* (2013.01)

(58) Field of Classification Search
None
See application file for complete search history.

(56) References Cited

U.S. PATENT DOCUMENTS

| 5,844,410 | A * | 12/1998 | Ikuta et al. ...................... 324/96 |
| 6,677,769 | B2 * | 1/2004 | Whitaker et al. ........ 324/754.23 |
| 7,385,393 | B2 * | 6/2008 | Iwanami et al. ........... 324/244.1 |
| 2008/0238419 | A1 | 10/2008 | Iwanami et al. |

(Continued)

FOREIGN PATENT DOCUMENTS

| JP | 8-54588 (A) | 2/1996 |
| JP | H8-43468 (A) | 2/1996 |

(Continued)

OTHER PUBLICATIONS

Wakana et al. (Performance of Fiber-Edge Magneto-optic Probe, Journal of Lightwave Technology, vol. 21, No. 12, Dec. 2003, pp. 3292-3299).*

(Continued)

*Primary Examiner* — Michelle R Connelly
(74) *Attorney, Agent, or Firm* — McGinn IP Law Group, PLLC

(57) ABSTRACT

In an electric/magnetic field probe using an optical fiber, when a stress is applied to the fiber, the polarization state of the light propagating in the fiber changes, and the signal level of the electric or magnetic field detection becomes unstable. For coping with this problem, for suppressing the curve or waggle of the optical fiber caused by a stress applied to the fiber, an electric/magnetic field sensor unit composed of the fiber and EO/MO material is fixed on a quartz substrate, for example, and the part of the fiber other than the sensor unit is stored in an acrylic tube and fixed. Further, polarization adjustment parts like a polarization controller, an optical analyzer or the like is installed in the housing, so that a stress caused by wind pressure or contact is not applied to the fiber connected to the parts.

17 Claims, 6 Drawing Sheets

(56) References Cited

U.S. PATENT DOCUMENTS

| | | | | |
|---|---|---|---|---|
| 2008/0310791 | A1* | 12/2008 | Huang | 385/12 |
| 2009/0234619 | A1* | 9/2009 | Iwanami et al. | 702/199 |
| 2009/0250213 | A1* | 10/2009 | Kalb et al. | 166/255.1 |
| 2011/0001971 | A1* | 1/2011 | Iwanami et al. | 356/364 |
| 2012/0164321 | A1* | 6/2012 | Nakada et al. | 427/131 |
| 2014/0029011 | A1* | 1/2014 | Digonnet et al. | 356/460 |

FOREIGN PATENT DOCUMENTS

| | | |
|---|---|---|
| JP | 2001-343410 (A) | 12/2001 |
| JP | 2004-212137 (A) | 7/2004 |
| JP | 2005-241489 (A) | 9/2005 |
| JP | 2005-308455 (A) | 11/2005 |
| JP | 2005-315697 (A) | 11/2005 |
| JP | 2007-57324 (A) | 3/2007 |
| JP | 2008-185575 (A) | 8/2008 |

OTHER PUBLICATIONS

Yamazaki et al. ("Three-dimensional magneto-optic near-field mapping over 10-50 μm-scale line and space circuit patterns", Lasers and Electro-Optics Society, 2001, LEOS 2001, vol. 1, pp. 318-319).*

International Search Report (ISR) (PCT Form PCT/ISA/210) for PCT/JP2010/060657, dated Aug. 17, 2010, previously filed Dec. 22, 2011.

Mizuki Iwanami, et al., "High Frequency Electric Field/Magnetic Field Measurements by Fiber-Optic Electrooptic/Magnetooptic Probe", Proceedings of the 2007 Society Conference of IEICE, Aug. 29, 2007, Tsushin (1), BS-3-3, pp. S-31 to S-32.

Japanese Office Action dated Jan. 7, 2014, with English translation.

* cited by examiner

PROBE FOR ELECTRIC/MAGNETIC FIELD

TECHNICAL FIELD

The present invention relates to a probe which measures an electric field or a magnetic field by using a laser light and electro-optic (EO) material or magneto-optic (MO) material.

BACKGROUND ART

As a tool for noise characteristic evaluation or immunity evaluation, a probe being able to detect an electric field or a magnetic field in high accuracy and in its 3 components of xyz is desired, and a probe using a laser light and optical material has been developed for these purposes. Such a probe is composed of an optical measurement apparatus like a laser optical source and EO/MO material. The electric/magnetic field is measured based on a basic principle that a laser light enters into the material and the refractive index of the material is changed correspondingly to the intensity of the electric/magnetic field. This kind of apparatus is grossly classified into: a type in which a light emitted from a laser optical source propagates in a space and enters into the EO/MO material; and a type in which whole of an optical measurement apparatus and the EO/MO material is connected by an optical fiber, and a laser light propagates through the optical fiber and enters into the material. Because high spatial resolution measurement in a micro region becomes possible by the microfabrication of the EO/MO material, such a probe is expected to achieve high performance in a performance evaluation, a trouble check, or an electric design for electronic circuits or parts mounted in high density.

Japanese Patent Application Publication JP2007-57324A is an example of the optical fiber type measurement system which optically detects the electric field intensity, magnetic field intensity or the like. A purpose of this technique is to prevent a variation of the detection sensitivity of a polarization maintaining fiber before and after a change of the environmental temperature, the stress magnitude or the like.

CITATION LIST

Patent Literature

[PTL 1] Japanese Patent Application Publication JP2007-57324A

SUMMARY OF INVENTION

Though the electromagnetic field probe using a laser light has some advantages in its large bandwidth, non-invasive nature, high spatial resolution and the like, it has a problem that its sensitivity is influenced by the variation of the polarization state. Specifically, in the EO/MO probe which uses an optical fiber, there is a problem that, when a curve or a waggle occurs in the fiber caused by a stress applied thereto, the polarization state of the light propagating through the fiber varies, and the signal level of the electric field detection or the magnetic field detection varies significantly.

For solving the above problem, a probe according to the present invention includes: a polarization control unit configured to influence a polarization state of an entered laser light; an electric/magnetic sensor unit which has electro-optic material or magneto-optic material to which the laser light outputted from the polarization control unit enters through an optical fiber; and an analyzer unit configured to generate a detection value of an electric field or a magnetic field at the electric/magnetic sensor unit based on the laser light outputted from the electro-optic material or the magneto-optic material. The electro-optic material or the magneto-optic material is fixed to a substrate. The optical fiber is fixed in a tube. The polarization control unit is fixed in housing.

More specifically, for example, for suppressing a curve or a waggle of an optical fiber caused by a stress applied thereto, electric/magnetic field sensor unit composed of a fiber and EO/MO material is fixed to a quartz substrate, for example, and a fiber arranged in a part other than the sensor unit is fixed by installing in an acrylic tube, for example. Further, polarized wave adjusting parts like a polarized wave controller or an optical analyzer are mounted in housing, so that a stress caused by a wind pressure or a contact is not applied to a fiber connected to the parts.

Because a polarization change of a laser light propagating through an optical fiber is suppressed, stabilized signal detection can be achieved, and an electric/magnetic field can be measured in high accuracy.

BRIEF DESCRIPTION OF DRAWINGS

The above object, other objects, effects, and characteristics of the present invention are made clearer from the description of exemplary embodiments and the accompanying drawings, in which.

DESCRIPTION OF EMBODIMENTS

Figure 1:
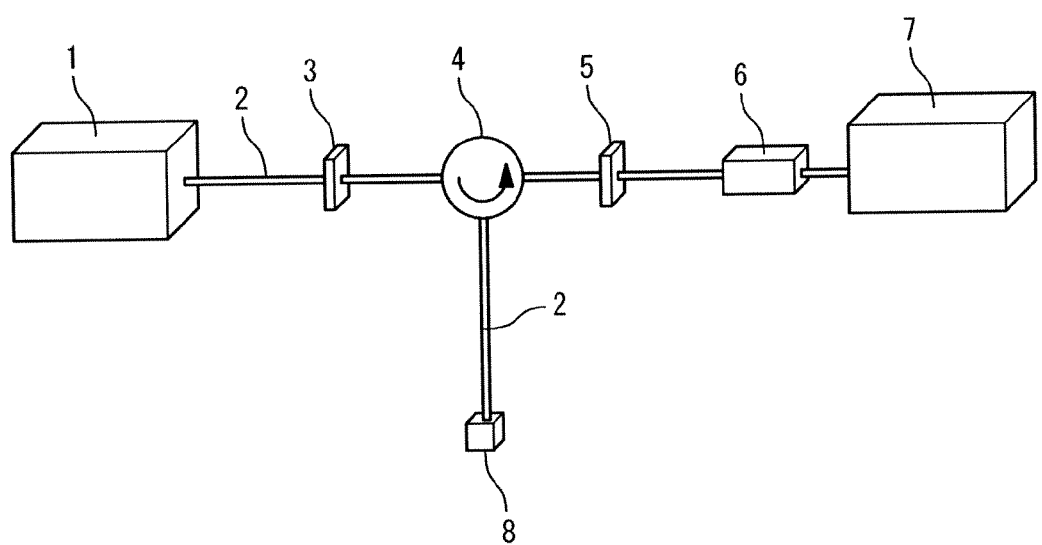
FIG. 1 is a conceptual view of a conventional electric/magnetic field probe apparatus using a laser light and optical material.

Some exemplary embodiments of a present invention will be described below in detail with reference to the drawings. FIG. 1 is a conceptual view of a conventional electric/magnetic field probe apparatus using a laser light and optical material. The light emitted by the laser optical source 1 travels through the core of a single mode fiber 2, is adjusted in its polarization by a polarization controller 3, travels through an optical circulator 4 to the EO/MO material 8. Because the refractive index of the EO/MO material changes in proportion to the external electric/magnetic field, the light propagating in the material senses the change of the refractive index in response to the external electric/magnetic field, and its polarization is modulated. After that, the light passes the circulator again, becomes an intensity modulated light by passing an optical analyzer 5. The photoelectric conversion is applied to the light by the optical receiver 6, and the electric signal is detected by the RF spectrum analyzer 7. By using the apparatus as shown in FIG. 1, an electric signal being in proportion to the intensity of the external electric/magnetic field can be obtained. However, in a case of the apparatus shown in FIG. 1, there is a problem that, if the light receives an external disturbance before passing the optical analyzer 5, its polarization state is changed, and the signal detected by the RF spectrum analyzer is changed dependently to the degree of the external disturbance.

Figure 2:
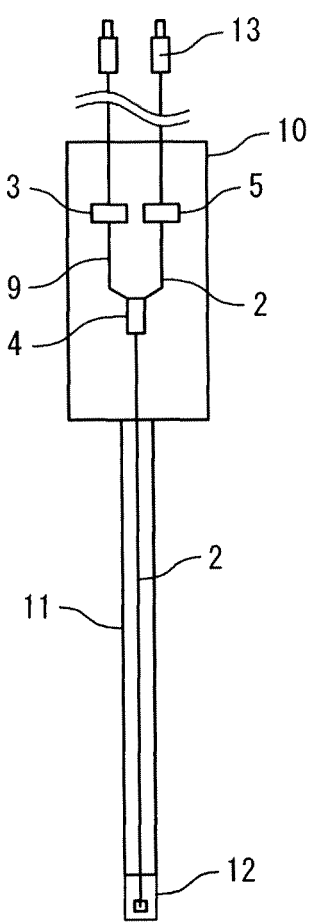
FIG. 2 is a conceptual view of a probe according to a first exemplary embodiment of the present invention.
Figure 3:
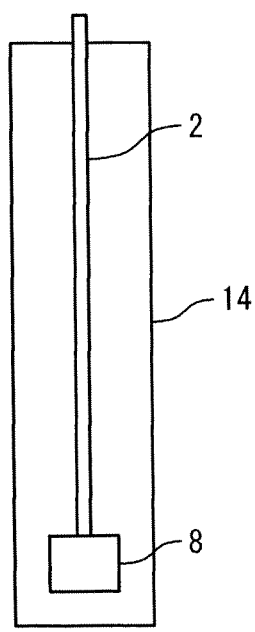
FIG. 3 is a conceptual view of an electric/magnetic field sensor unit of a probe according to the first exemplary embodiment of the present invention.

FIG. 2 shows an exemplary embodiment of the present invention for solving the above problem. FIG. 3 is an enlarged view of the electric/magnetic field sensor unit 12 of FIG. 2. The EC/MO material 8 forming the electric/magnetic field sensor 12 and the signal mode fiber 2 which guides the light introduced to the EO/MO material 8 are stuck and fixed to the substrate 14. Other than the edge part where the electric/magnetic field sensor 12 is arranged, the signal mode fiber 2 is arranged inside and fixed to the tube 11.

The substrate 14 is fixed to the tube 11 by the following manner. At first, material whose section vertical to the lengthwise direction is a tubular shape is provided as material for the tube 11. This material has a wall thickness between an inner side tubular surface faced to a hollow internal space and an outer side tubular surface. The diameter of the inner side tubular surface is smaller than the width direction of the substrate. An edge of this material is cut to become a half of tubular shape. By this cutting, the wall thickness part between the inner side tubular surface and the outer side tubular surface is exposed. By applying adhesive material to the thickness part and by contacting the surface of the substrate 14 with the applied surface, the substrate 14 is fixed to the tube 11. A part of the substrate 14 is preferably formed to be inserted to the internal tubular surface of the tube 11 from the viewpoint of the stability of the relative position between the substrate 14 and the tube 11.

Further, polarization adjustment parts like the polarization controller 3, the optical analyzer 5 or the like are installed in the housing 10. Specifically, the polarization controller 3, the optical circulator 4 and the optical analyzer 5 are fixed to the housing. The housing 10 and the tube 11 are fixed so that their relative position is not moved. Also, the tube 11 and the substrate 14 are fixed so that their relative position is not moved.

A laser light is introduced to the polarization controller 3 from one terminal 13 via an optical fiber. The output light of the polarization controller 3 is introduced to the single mode fiber 2 arranged on an electric/magnetic field sensor unit side through the polarization maintaining fiber 9 and via the optical circulator 4. The light introduced in the signal mode fiber 2 passes and is reflected by the EO/MO material 8 in the electric/magnetic sensor unit 12. The reflected light is introduced in the signal mode fiber 2. The reflected light in the signal mode fiber 2 is introduced to the direction of the optical analyzer 5 by the optical circulator 4. The light passes through the optical analyzer 5 is outputted to the RF spectrum analyzer from another terminal 13. The RF spectrum analyzer connected to the terminal 13 functions as an analysis unit which generates a signal showing the detection value of the electric or magnetic field at the electric/magnetic field sensor unit 12.

In such a configuration, the stress applied to the fiber connected to various parts caused by wind pressure, contact or the like can be suppressed by the housing 10, tube 11 and substrate 14. Further, in this exemplary embodiment, the optical path of the emitting side is folded from the entering optical path by 180 degree. Therefore, the polarization controller 3 being an optical part of the entering side and the optical analyzer being an optical part arranged on the emitting side across the electric/magnetic sensor unit 12 are stored in the same housing so that the size of the apparatus can be reduced and the ability to withstand the stress can be improved.

Figure 4:
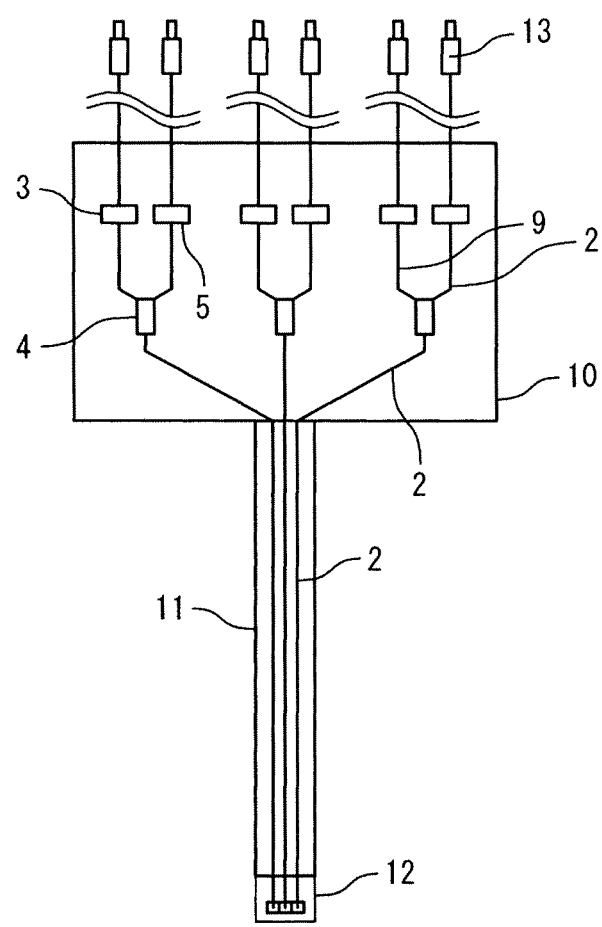
FIG. 4 is a conceptual view of a probe according to a second exemplary embodiment of the present invention.

FIG. 4 shows a second exemplary embodiment of the present invention. A probe which is able to measure three components of the electric or magnetic field being orthogonal to each other, being an electric/magnetic sensor 12 composed of three single mode fibers 2 and the EO/MO material formed on the edges of the respective single mode fibers, is fixed on a single substrate. The part of the plurality of single mode fibers 2 other than the electric/magnetic field sensor unit 12 is stored in and fixed to a same tube 11. Further, a polarization adjustment unit like three types of polarization controllers, an optical analyzer or the like is installed in a same housing 10 so that a stress caused by wind pressure, contact or the like is not applied to the fiber being connected to the part.

Figure 5:
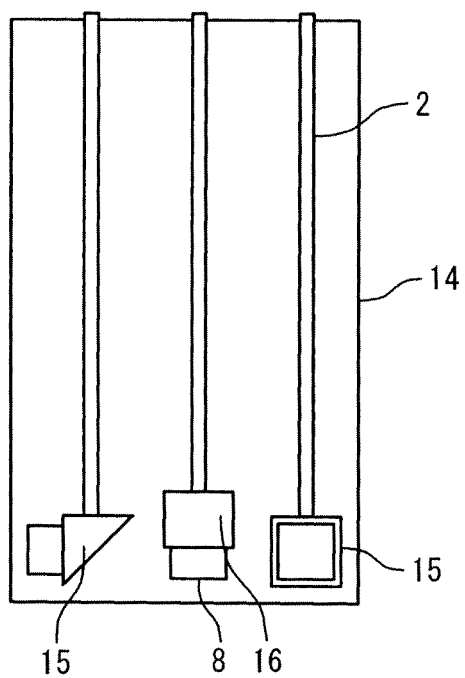
FIG. 5 is a conceptual view of an electric/magnetic field sensor unit of a probe according to the second exemplary embodiment of the present invention.

FIG. 5 is a conceptual view of the electric/magnetic field sensor unit of a probe according to the second exemplary embodiment of the present invention. Both of the three single mode fibers 2 and the EO/MO material formed on each of the single mode fibers 2 are adhered and fixed to the substrate 14. Each of three fibers has an edge on which the EO/MO material is formed and is formed to detect one of the three components of the electric/magnetic field independently. For the detection in which each component is decomposed, the optical parts in which the respective optical paths in the three EO/MO materials are orthogonal to each other are fixed to the substrate 14. For example, in the first fiber, the first triangular prism is arranged so that a light enters to the EC/MO material 8 in a direction vertical to the entering optical path. In the second fiber, the second triangular prism is arranged so that a light enters to the EO/MO material in a direction vertical to both of the entering optical path and the emitting light of the first triangular prism. In the third fiber, a glass spacer is formed so that its optical path and the length thereof become equal to those of the prisms of the first and second fibers.

Laser lights are introduced to three polarization controllers 3 from a plurality of input terminals 13. This laser light may be introduced from a plurality of laser light sources being formed in correspondence to each of the plurality of input terminals 13, or may be introduced from a single laser light source which is connected to the plurality of input terminals 13 via a selection switch for selectively supply the laser light to any of the plurality of input terminals 13. Those lights pass through the first triangular prism 15, the second triangular prism and the glass spacer 16, and is outputted by the plurality of input terminals 1, and is introduced to and analyzed by the RF spectrum analyzer. Then, the electric or magnetic field can be detected by decomposing their three components. Because the three sets of the optical parts for measuring the three components are supported by the same housing 10, tube 11 and the substrate 14, the stress caused by wind pressure, contact or the like can be suppressed by adding a small number of parts.

Figure 6:
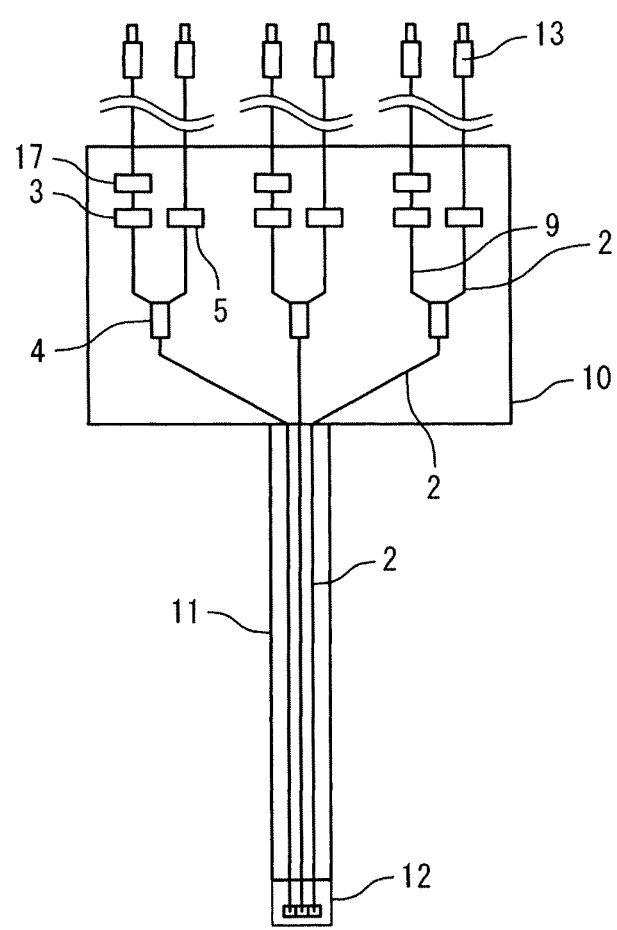
FIG. 6 is a conceptual view of a probe according to a third exemplary embodiment of the present invention.

FIG. 6 shows a third exemplary embodiment of the present invention. A probe which is able to measure three components of the electric or magnetic field which are orthogonal to each other, being an electric/magnetic sensor 12 composed of three single mode fibers 2 and the EO/MO material formed on the edges of the respective single mode fibers, is fixed on a substrate, and the fibers in a part other than the electric/magnetic field sensor unit 12 are stored in and fixed to the tube 11. Further, polarization adjustment parts like three types of polarizers, polarization controllers, optical analyzers or the like are installed in the housing 10 so that a stress caused by wind pressure, contact or the like is not applied to the fiber connected to the parts. By forming a polarizer in a former stage of the polarization controller, the polarization state of the light after passing the polarizer always becomes linear regardless of the polarization state of the light enters to the polarizer, so that the signal variation caused by an external disturbance applied to the fiber can be further suppressed.

Next, an example of the present invention is explained by referring to FIGS. 4 and 5. In an example of a probe according to the present invention, for example, in FIG. 4, the input optical fiber is a polarization maintaining fiber 9, the housing 10 and the tube 11 are formed by resin like acrylic, and the material of the substrate 14 in FIG. 5 is quartz. Because metal is not used in the housing, tube and the substrate, the disturbance of the measuring electric/magnetic field at the probe can be highly suppressed so that the measurement can be achieved at high accuracy. The housing 10 and the tube 11, and the tube 11 and the substrate 14 are connected to each other by using adhesive material like epoxy resin series, for example. As EO material, single crystal of compound (BSO) composed of Bismuth, Silicon and Oxygen is used, for example, and as MO material, single crystal of Bismuth-substituted Yttrium Iron Garnet (Bi-YIG) is used, for example.

The above explained some exemplary embodiments and examples can be implemented by any combination thereof in a range where any contradiction does not occur.

As an example of the application of the present invention, a probe for immunity evaluation of an electronic circuit can be referred to. For recognizing the mechanism of an erroneous operation of an electronic device, the electric/magnetic field distribution in the vicinity of the electronic circuit in the device is needed to be accurately detected. By using a probe according to the present invention, an accurate measurement of the three components of the electric or magnetic field in the vicinity of an electronic circuit becomes possible, so that recognition for investigating the mechanism of an erroneous operation of the device can be obtained.

This application claims the priority of the Japanese Patent Application JP2009-153787 filed on Jun. 29, 2009, and the disclosure of which is incorporated herein by this reference.

The invention claimed is:

1. A probe comprising:
    first, second and third detectors; and
    an analyzer unit,
    wherein each of the first, second and third detectors comprise:
        a polarization control unit configured to influence a polarization state of an entered laser light;
        an optical fiber;
        an optical circulator for transmitting laser light outputted from the polarization control unit to the optical fiber;
        an electric/magnetic sensor unit comprising an electro-optic material or magneto-optic material to which laser light outputted from the optical circulator enters through the optical fiber; and
        an optical analyzer for modulating an intensity of laser light outputted from the electric/magnetic sensor unit,
    wherein the analyzer unit is configured to generate a detection value of an electric field or a magnetic field at the electric/magnetic sensor unit of each of the first, second and third detectors, based on laser light outputted from the optical analyzer of each of the first, second and third detectors,
    wherein the electro-optic material or the magneto-optic material of each of the first, second and third detectors is fixed to a substrate,
    wherein the optical fiber of each of the first, second and third detectors is fixed in a tube which is fixed to the substrate,
    wherein the optical fiber of each of the first, second and third detectors is connected to a triangular prism or a glass spacer, and
    wherein the polarization control unit, all of the optical circulators and all of the optical analyzers are connected to the optical fiber of each of the first, second and third detectors, and the polarization control unit, all of the optical circulators, all of the optical analyzers and all of the optical fibers are fixed in the same housing.

2. The probe according to claim 1, wherein the substrate comprises quartz, and the tube and the housing comprise resin.

3. The probe according to claim 2, wherein the polarization control unit comprises a plurality of parts for polarization control which are fixed to the housing, and the laser light is inputted to the plurality of parts for polarization control respectively,
    the electric/magnetic sensor unit has a plurality of pieces of electro-optic material or magneto-optic material which corresponds to the plurality of parts for polarization control respectively, and the laser light enters in the plurality of the pieces of electro-optic material or magneto-optic material through a plurality of optical fibers fixed in the tube, and
    a plurality of optical parts configured to detect different components of an electric field or a magnetic field are mounted on the plurality of the pieces of electro-optic material or magneto-optic material and fixed to the substrate.

4. The probe according to claim 1, wherein the polarization control unit comprises a plurality of parts for polarization control which are fixed to the housing, and the laser light is inputted to the plurality of parts for polarization control respectively,
    the electric/magnetic sensor unit has a plurality of pieces of electro-optic material or magneto-optic material which corresponds to the plurality of parts for polarization control respectively, and the laser light enters in the plurality of the pieces of electro-optic material or magneto-optic material through a plurality of optical fibers fixed in the tube, and
    a plurality of optical parts configured to detect different components of an electric field or a magnetic field are mounted on the plurality of the pieces of electro-optic material or magneto-optic material and fixed to the substrate.

5. The probe according to claim 1, further comprising:
    a polarization maintaining fiber formed in the housing and transmitting the laser light outputted from the polarization control unit.

6. A probe comprising:
    a housing;
    first, second and third detectors, each detector of the first, second and third detectors comprising:
        a polarization control unit formed in the housing and influencing a polarization state of a laser light;
        an optical circulator for transmitting laser light outputted from the polarization control unit;
        an optical fiber which is formed in a tube and fixed to a substrate, the optical fiber being connected to a triangular prism or a glass spacer and transmitting the laser light outputted from the optical circulator;
        an electric/magnetic sensor unit comprising a material which is formed on the substrate and to which the laser light outputted from the polarization control unit enters through the optical fiber; and
        an optical analyzer for modulating an intensity of laser light outputted from the electric/magnetic sensor unit; and an analyzer unit generating a detection value of a field at the electric/magnetic sensor unit of each of the first, second and third detectors, based on the laser light outputted from the material, wherein the polarization control unit, the optical circulator and the optical analyzer of each detector of the first second and third detectors are connected to the optical fiber, and the polarization control unit, the optical circulator, the optical analyzer and the optical fiber of each detector of the first second and third detectors are fixed in the housing.

7. The probe of claim 6, wherein the material in the electric/magnetic sensor unit comprises one of:
an electro-optic material comprising a single crystal of compound (BSO) composed of Bismuth, Silicon and Oxygen; and
a magneto-optic material comprising a single crystal of Bismuth-substituted Yttrium Iron Garnet (Bi-YIG).

8. The probe of claim 6, wherein a part of the substrate is inserted into the tube and the tube is fixed to the substrate by an adhesive, such that the optical fiber is fixed to the substrate.

9. The probe of claim 6, further comprising:
a polarization maintaining fiber formed in the housing and transmitting the laser light outputted from the polarization control unit.

10. The probe of claim 9, wherein the polarization control unit, the optical circulator and the analyzer unit are fixed to the housing, and the tube is fixed to the housing by an adhesive.

11. The probe of claim 6, wherein the laser light outputted from the material comprises light reflected from the material in the electric/magnetic sensor unit.

12. The probe of claim 6, further comprising:
a first terminal, the laser light being introduced to the polarization control unit from the first terminal via an optical fiber;
a second terminal; and
a radio frequency (RF) spectrum analyzer which is connected to the second terminal, the light passing through the analyzer unit being outputted to the RF spectrum analyzer via the second terminal, and the RF spectrum analyzer generating a signal showing a detection value of an electric field or magnetic field at the electric/magnetic sensor unit.

13. The probe of claim 6, wherein the housing comprises an entering side and an emitting side, and the polarization control unit is formed in the entering side and the analyzer unit is formed in the emitting side across from the polarization control unit, such that an optical path of the emitting side is folded from an optical path of the entering side by 180 degrees.

14. A probe comprising:
a housing;
a plurality of detectors, each detector of the plurality of detectors comprising:
a polarization control unit formed in the housing and influencing a polarization state of a laser light;
an optical circulator formed in the housing and transmitting laser light outputted from the polarization control unit;
an optical fiber which is formed in the housing and in a tube and fixed to a substrate, the optical fiber being connected to a triangular prism or a glass spacer and transmitting the laser light outputted from the optical circulator;
an electric/magnetic sensor unit comprising a material which is formed on the substrate and to which the laser light outputted from the polarization control unit enters through the optical fiber; and
an optical analyzer which modulates an intensity of laser light outputted from the electric/magnetic sensor unit; and
an analyzer unit generating a detection value of a field at the electric/magnetic sensor unit of each detector of the plurality of detectors, based on the laser light outputted from the material,
wherein the polarization control unit, the optical circulator and the optical analyzer of each detector of the plurality of detectors are connected to the optical fiber.

15. The probe of claim 14, wherein the plurality of detectors comprises first, second and third detectors.

16. The probe of claim 14, wherein the optical fiber in each detector of the plurality of detectors is formed in the same tube.

17. The probe of claim 14, wherein the plurality of detectors detect a plurality of components of the field at the electric/magnetic sensor unit, respectively.

* * * * *